US009099547B2

(12) United States Patent
Martens et al.

(10) Patent No.: US 9,099,547 B2
(45) Date of Patent: Aug. 4, 2015

(54) TESTING PROCESS FOR SEMICONDUCTOR DEVICES

(75) Inventors: Stefan Martens, Munich (DE); Mathias Vaupel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 109 days.

(21) Appl. No.: 13/312,758

(22) Filed: Dec. 6, 2011

(65) Prior Publication Data
US 2013/0084659 A1 Apr. 4, 2013

Related U.S. Application Data

(63) Continuation-in-part of application No. 13/252,816, filed on Oct. 4, 2011, now Pat. No. 8,883,565.

(51) Int. Cl.
H01L 21/00 (2006.01)
H01L 21/78 (2006.01)
H01L 21/66 (2006.01)

(52) U.S. Cl.
CPC ............... *H01L 21/78* (2013.01); *H01L 22/14* (2013.01)

(58) Field of Classification Search
CPC ....... A01B 12/006; H01L 21/78; H01L 22/14
USPC ......................................................... 438/113
See application file for complete search history.

(56) References Cited

U.S. PATENT DOCUMENTS

| 3,757,367 | A | | 9/1973 | Campbell |
| 5,062,898 | A | | 11/1991 | McDermott et al. |
| 5,539,325 | A | * | 7/1996 | Rostoker et al. ......... 324/750.05 |
| 5,766,061 | A | | 6/1998 | Bowers |
| 5,775,127 | A | | 7/1998 | Zito |
| 5,853,962 | A | | 12/1998 | Bowers |
| 5,908,510 | A | | 6/1999 | McCullough et al. |
| 5,931,721 | A | | 8/1999 | Rose et al. |
| 6,036,581 | A | | 3/2000 | Aoki |

(Continued)

FOREIGN PATENT DOCUMENTS

CN 101044613 A 9/2007

OTHER PUBLICATIONS

Busnaina, A.A., et al., "The Removal of Submicron Particles Using Co2 Aerosol with Emphasis on Post-CMP Applications," 3 pages, Microcontamination Research Laboratory Northeastern University, Boston, MA.

(Continued)

*Primary Examiner* — Ajay K Arora
(74) *Attorney, Agent, or Firm* — Slater & Matsil, L.L.P.

(57) ABSTRACT

In accordance with an embodiment of the present invention, a method of manufacturing a semiconductor device includes providing a wafer having a top surface and an opposite bottom surface. The top surface has a plurality of dicing channels. The wafer has a plurality of dies adjacent the top surface. Each die of the plurality of dies is separated by a dicing channel of the plurality of dicing channels from another die of the plurality of dies. Trenches are formed in the wafer from the top surface. The trenches are oriented along the plurality of dicing channels. After forming the trenches, the plurality of dies is tested to identify first dies to be separated from remaining dies of the plurality of dies. After testing the plurality of dies, the wafer is subjected to a grinding process from the back surface. The grinding process separates the wafer into the plurality of dies.

25 Claims, 8 Drawing Sheets

(56) References Cited

U.S. PATENT DOCUMENTS

| | | | |
|---|---|---|---|
| 6,066,032 | A | 5/2000 | Borden et al. |
| 6,203,406 | B1 | 3/2001 | Rose et al. |
| 6,332,470 | B1 | 12/2001 | Fishkin et al. |
| 6,972,202 | B2 | 12/2005 | Nishihashi et al. |
| 7,135,384 | B2 | 11/2006 | Takyu et al. |
| 7,923,351 | B2 | 4/2011 | Arita |
| 2001/0043076 | A1* | 11/2001 | Itasaka et al. ............ 324/765 |
| 2002/0013061 | A1* | 1/2002 | Siniaguine et al. ........ 438/706 |
| 2002/0030040 | A1 | 3/2002 | Farnworth |
| 2003/0160315 | A1* | 8/2003 | Kovar et al. ............. 257/685 |
| 2003/0188763 | A1 | 10/2003 | Banerjee et al. |
| 2004/0232524 | A1* | 11/2004 | Howard et al. ........... 257/620 |
| 2005/0146013 | A1* | 7/2005 | Farnworth et al. ........ 257/691 |
| 2005/0287952 | A1* | 12/2005 | Ryan et al. ............. 455/63.1 |
| 2008/0213978 | A1 | 9/2008 | Henry et al. |
| 2009/0209087 | A1* | 8/2009 | Arita .................... 438/462 |
| 2011/0193200 | A1 | 8/2011 | Lyne et al. |

OTHER PUBLICATIONS

Mariani, F., et al., "Current Challenges in Preassembly: The Focus Changes from Thinning to Singulation," KGD Packaging & Test Workshop, Sep. 9-12, 2007, 29 pages, Napa, California.

Sherman, R., et al., "Surface Cleaning with the Carbon Dioxide Snow Jet," Journal of Vacuum Science and Technology A, American Vacuum Society, vol. 12, Issue 4, Jul./Aug. 1994, pp. 1876-1881.

Tourdot, J.M., "A Comparison of Wet Manual Cleaning Processes to Carbon Dioxide Cleaning Processes in the Semiconductor Industry," A Research Paper Submitted in Partial Fulfillment of the Requirements for the Masters of Science Degree in Risk Control, May 2001, 35 pages, University of Wisconsin Stout.

"Carbon Dioxide Cleaning: Going Through Phases," A Panel Discussion of Co2Cleaning Technology, International Cleaning Technology Exposition, CleanTech'99, Jul./Aug. 1999, 1 cover page, pp. 27-34.

* cited by examiner

TESTING PROCESS FOR SEMICONDUCTOR DEVICES

This application is a Continuation in Part of U.S. application Ser. No. 13/252,816, filed on Oct. 4, 2011, entitled "Separation of Semiconductor Devices from a Wafer Carrier," which application is hereby incorporated herein by reference.

TECHNICAL FIELD

The present invention relates generally to semiconductor packages, and more particularly to a testing process for semiconductor devices.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, the semiconductor devices on the wafer are separated. For example, the wafer may undergo singulation. During singulation, the wafer is mechanically and/or chemically treated and the semiconductor devices are physically separated to form individual dies. Singulation can introduce damage to the die resulting in failed or defective units. However, identifying damaged dies after singulation is prohibitively expensive and therefore not commercially viable.

SUMMARY OF THE INVENTION

These and other problems are generally solved or circumvented, and technical advantages are generally achieved, by illustrative embodiments of the present invention.

In accordance with an embodiment of the present invention, a method of manufacturing a semiconductor device comprises providing a wafer having a top surface and an opposite bottom surface. The top surface comprises a plurality of dicing channels. The wafer comprises a plurality of dies adjacent the top surface. Each die of the plurality of dies is separated by a dicing channel of the plurality of dicing channels from another die of the plurality of dies. Trenches are formed in the wafer from the top surface. The trenches are oriented along the plurality of dicing channels. After forming the trenches, the plurality of dies is tested to identify first dies to be separated from remaining dies of the plurality of dies. After testing the plurality of dies, the wafer is subjected to a grinding process from the back surface. The grinding process separates the wafer into the plurality of dies.

In accordance with another embodiment of the present invention, the method of manufacturing a semiconductor device comprises providing a wafer having a top surface and an opposite bottom surface. The top surface comprises a plurality of dicing channels. The wafer comprises a plurality of dies adjacent the top surface. Each die of the plurality of dies is separated by a dicing channel of the plurality of dicing channels from another die of the plurality of dies. The method further comprises coating the top surface of the wafer with a photo resist layer and patterning the photo resist layer to expose a portion of the top surface. Next, trenches are etched in the wafer with a plasma dicing process using the patterned photo resist layer. The trenches are oriented along the plurality of dicing channels. After forming the trenches, the plurality of dies is tested to identify defective dies. After testing the plurality of dies, the wafer is subjected to a grinding process from the back surface to separate the wafer into the plurality of dies.

In accordance with another embodiment of the present invention, the method of manufacturing a semiconductor device comprises providing a wafer having a top surface and an opposite bottom surface. The top surface comprises a plurality of dicing channels. The wafer comprises a plurality of dies adjacent the top surface. Each die of the plurality of dies is separated by a dicing channel of the plurality of dicing channels from another die of the plurality of dies. The method further comprises forming trenches in the wafer from the top surface. The trenches are oriented along the plurality of dicing channels. The trenches are filled with a sacrificial material. After forming the trenches, the plurality of dies are tested to identify first dies for separation from remaining dies of the plurality of dies. After testing the plurality of dies, the wafer is subjected to a grinding process from the back surface to expose a lower surface of the plurality of dies. Back side contacts are formed on the lower surface of the plurality of dies. The plurality of dies is separated by removing the sacrificial material.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise

DETAILED DESCRIPTION OF ILLUSTRATIVE EMBODIMENTS

Figure 1A:
FIGS. 1-10 illustrate a method of fabricating a semiconductor device using a dicing-testing-grinding (DTG) process flow during various stages of processing in accordance with embodiments of the invention.

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Chip Scale Packages (CSP) are used for packing small components such as diodes, transistors, and others. CSPs typically have an area no greater than 1.2 times that of the die and are usually a single-die, direct surface mountable package. For example, die sizes may be vary between about 0.05 mm$^2$ to about 50 mm$^2$. Because of the small sized dies, each wafer yields many thousand units. For example, an 8-inch wafer can yield up to 600,000 dies.

Due to the large number of dies, testing of these dies can be economically performed only in a parallel setup. Serially or sequentially testing the dies will increase the amount of time for testing, which will dramatically increase the cost of the packaged product.

In conventional processes, dies are tested prior to singulation so that all or a large number of the dies on a wafer can be tested in parallel. However, singulation processes can increase defectivity. For example, dicing processes such as mechanical sawing can generate sawing damage such as chipping, cracking or other. Therefore all dies must be tested after singulation, which increases the cost and time of the testing process, because after singulation a parallel testing setup is no longer feasible.

Embodiments of the invention overcome these and other limitations of conventional processes and provide a fast and cost efficient testing process that can be performed after the completion of sawing processes. Embodiments of the invention introduce a testing process after a partial singulation process. The testing is introduced after the completion of the portion of the singulation process that introduces the most number of defects. Remaining singulation steps performed after testing do not introduce a significant number of defects and hence can be performed without significantly increasing the fail rate of the final product.

In various embodiments, the present invention describes a method to ensure a near zero defect levels after fabrication by the elimination of defective dies while reducing the cost of testing processes. This is accomplished using a Dicing-Testing-Grinding (DTG) process flow.

In particular, in various embodiments, testing is performed after dicing but prior to grinding, which completes the singulation of the substrate. Thus, the testing is performed during the singulation ensuring that dicing induced defects are identified and therefore removed. At the same time, testing is performed in parallel minimizing the cost of testing. This process is particularly applicable to dies having no back side metallization. This is because, after the DTG process, the backside metallization must be added for each die individually and cheaper wafer level processes cannot be used for forming backside metallization.

A first embodiment of a method of fabricating a semiconductor device will be described using FIGS. 1-10. Alternative methods of fabrication will be described using FIGS. 11-12 and FIGS. 13-14. An alternative embodiment of fabricating a semiconductor device having back side contacts will be described using FIGS. 15-20.

FIGS. 1-10 illustrate a method of fabricating a semiconductor device during various stages of processing in accordance with embodiments of the invention.

Figure 1B:
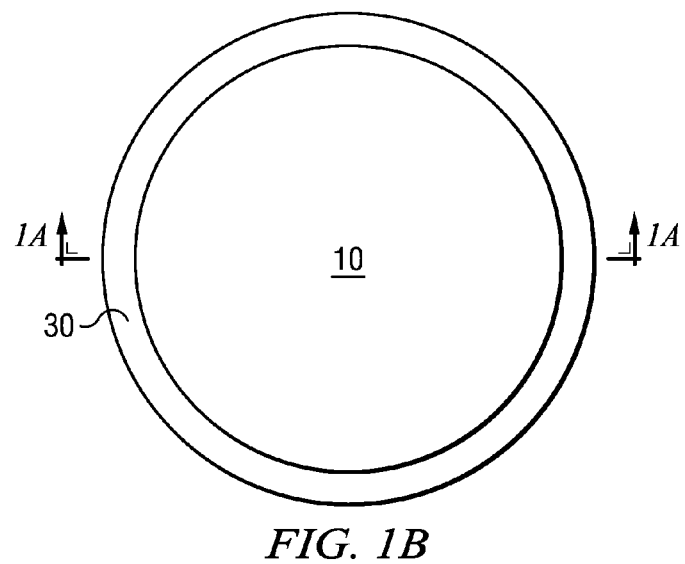
Figure 1C:
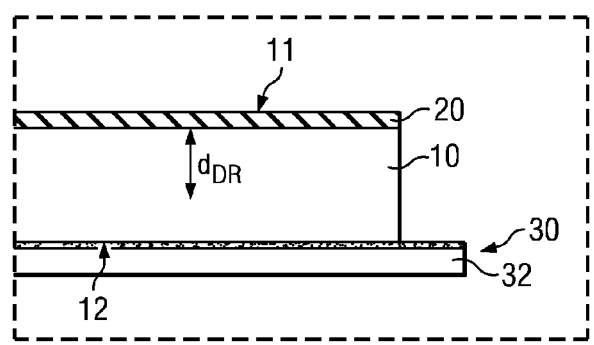
Figure 1D:
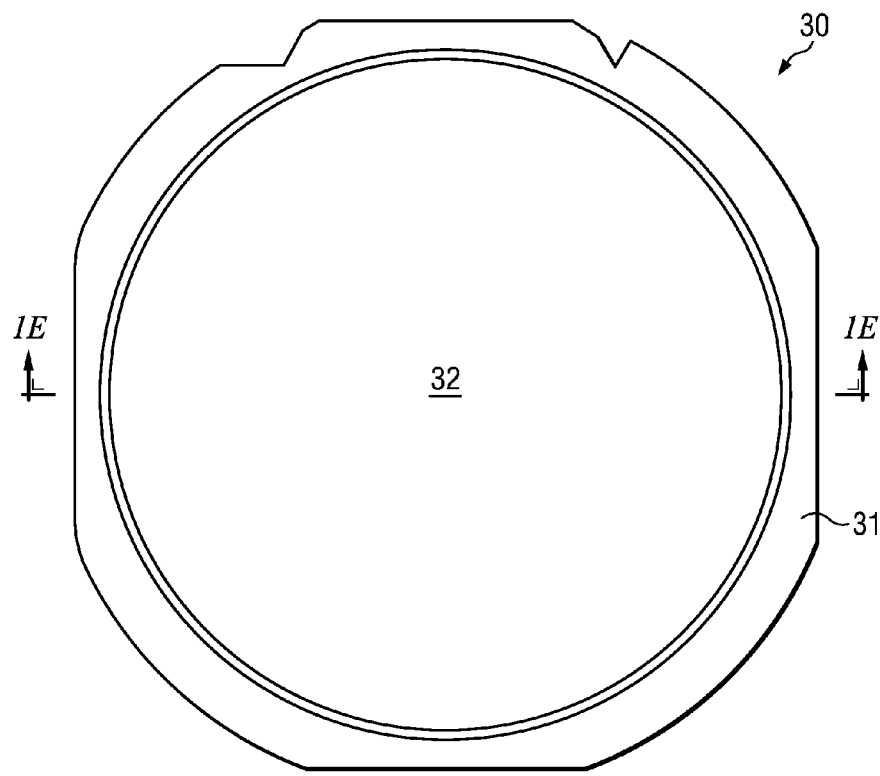
Figure 1E:
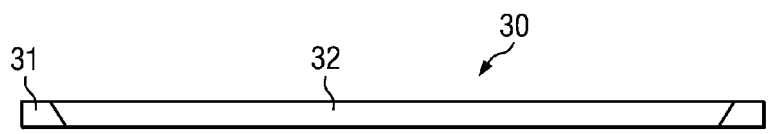

FIG. 1, which includes FIGS. 1A-1E, illustrates a semiconductor wafer during one stage of fabrication process, wherein FIG. 1A illustrates a cross-sectional view of the wafer and FIG. 1C is the magnified cross-sectional view, FIG. 1B illustrates a top view, wherein FIG. 1D illustrates a top view of a carrier, and FIG. 1E illustrates a cross sectional view of the carrier illustrating a frame and an adhesive foil.

Referring to FIG. 1, a substrate 10 is illustrated after the formation of active regions of the device. The active regions may comprise a discrete device such as a diode or a transistor in one embodiment. In other embodiments, the active regions may comprise a plurality of transistors and/or diodes forming an integrated circuit. In one embodiment, the substrate 10 may comprise a semiconductor wafer such as a silicon wafer. In other embodiments, the substrate 10 may comprise other semiconductor materials including alloys such as SiGe, SiC or compound semiconductor materials such as GaAs, InP, InAs, GaN, sapphire, silicon on insulation, for example.

The substrate 10 comprises a top surface 11 and an opposite bottom surface 12 (FIG. 1C). In various embodiments, the active devices are formed closer to the top surface 11 of the substrate 10 than the bottom surface 12. The active devices are formed in a device region of the substrate 11. Device region extends over a depth $d_{DR}$, which depending on the device, is about 50 µm to about 500 µm, and about 200 µm in one embodiment. The device region has a plurality of dies 100 formed therein. Each die may comprise a discrete device such as a diode or a transistor in one embodiment. Alternatively, each die of the plurality of dies 100 comprises an integrated circuit.

In various embodiments, the substrate also includes all necessary interconnects, connections, pads etc. for coupling between devices and/or with external circuitry. The substrate 10 may include a protective layer 20 for further processing. The protective layer 20 may comprise an oxide, nitride, polyimide, or other suitable materials known to one skilled in the art. The protective layer 20 may comprise a hard mask in one embodiment, and a resist mask in another embodiment. The protective layer 20 helps to protect the active region during subsequent processing.

During processing, the wafer is placed on a carrier 30. The carrier 30 comprises a frame 31, which is an annular structure (ring shaped) with an adhesive foil 32 in one embodiment. The adhesive foil 32 is supported along the outer edges by the frame 31 in one or more embodiments. In alternative embodiments, the frame 31 may comprise other suitable shapes. FIG. 1D illustrates a top view of the carrier 30 and FIG. 1E illustrates a cross sectional view of the carrier 30 illustrating the frame 31 and the adhesive foil 32.

Figure 2:
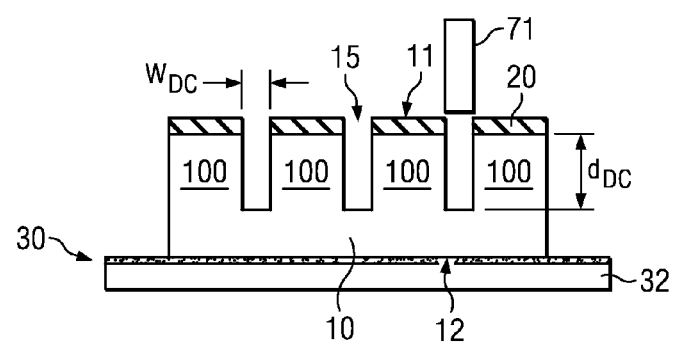

FIG. 2 illustrates a cross-sectional portion of the substrate 10, for example, as illustrated in FIG. 1C. As illustrated in FIG. 2, the substrate 10 is diced by physically separating the devices (dies 100) adjacent the top surface 11 of the substrate 10. In one or more embodiments, the substrate 10 is diced along dicing channels 15 (also called dicing street or kerf), for example, using a mechanical saw 71. In one or more embodiments, a dicing saw 71 made of diamond particles cuts through the substrate 10 along dicing channels 15. The dicing channels 15 separate the individual dies 100 on the substrate 10. The width of the dicing channels 15 $W_{DC}$ may be a function of the dicing process. For example, mechanical sawing processes damage more of the substrate 10 and therefore require a larger area for dicing, i.e., a wider dicing channel. In one or more embodiments, a dicing channel having a width $W_{DC}$ of about 10 µm to about 150 µm is used with a mechanical sawing process. The width of the dicing channel is about 30 µm in one embodiment.

In various embodiments, the dicing process is stopped leaving an un-diced portion of the substrate 10. In various embodiments, the depth of the dicing channel $d_{DC}$ depends on the target device thickness and is about 50 µm to about 500 µm, and about 200 µm in one embodiment. In another embodiment, the depth of the dicing channel $d_{DC}$ is about 100 µm to about 300 µm. The substrate 10 has a thickness much larger than the depth of the dicing channel, for example an 8-inch wafer has a thickness of about 700 µm. In various embodiments, the ratio of depth of the dicing channel $d_{DC}$ to the thickness of the substrate is about 0.1:1 to about 0.5:1. Therefore, despite the presence of the dicing channel, the substrate 10 is mechanically stable for subsequent processing.

Figure 3A:
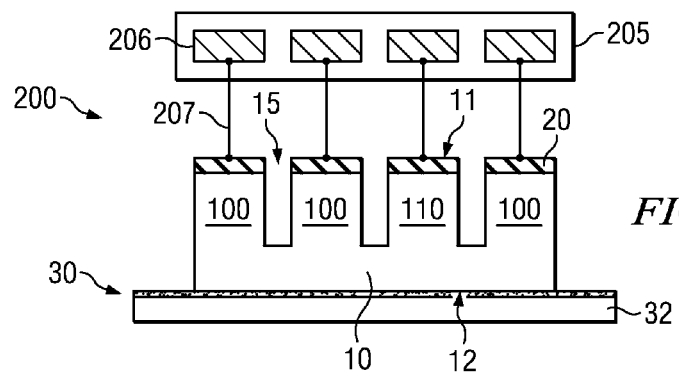
Figure 3B:
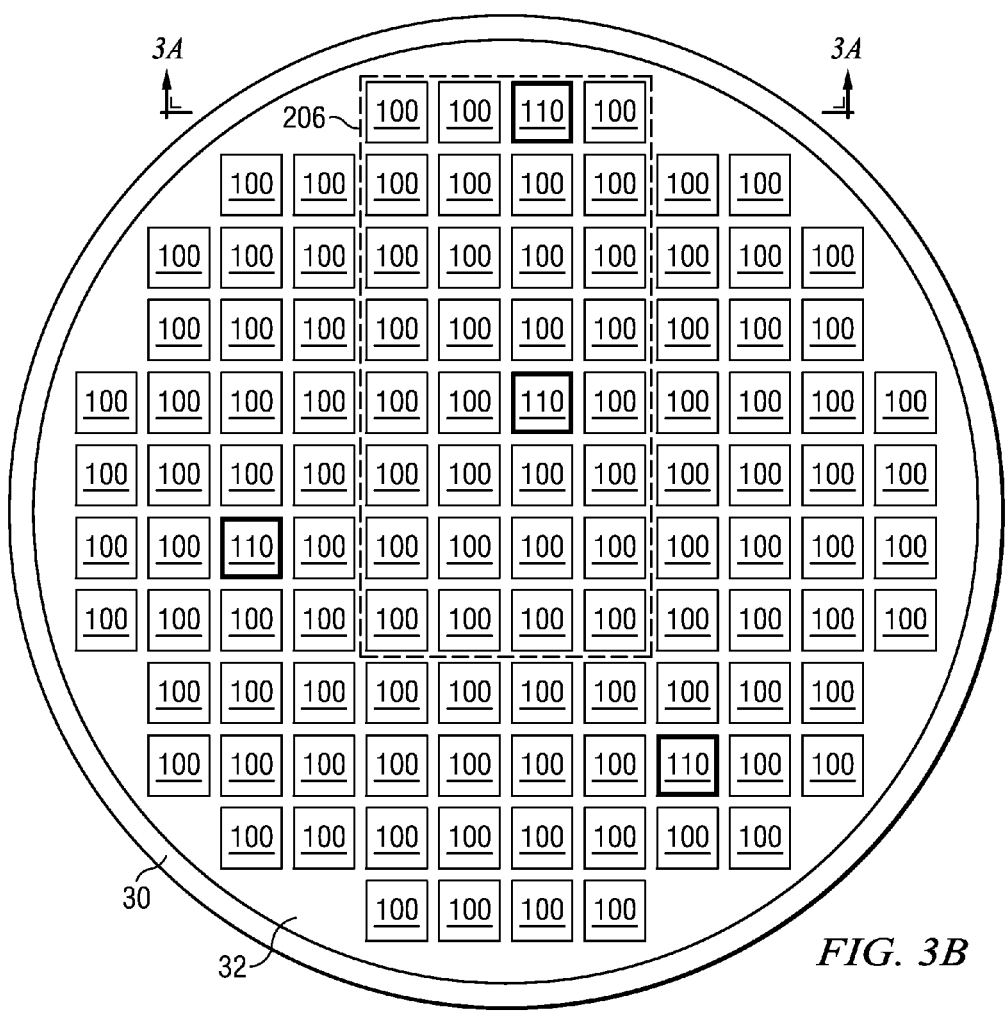

FIG. 3, which includes FIGS. 3A and 3B, illustrates a testing process performed after the dicing process in accordance with an embodiment of the invention, wherein FIG. 3A illustrates a cross-sectional view and FIG. 3B illustrates a top view. The carrier 30 is placed in a testing apparatus 200. The testing apparatus 200 has a test head 205 with a plurality of testers 206. Each tester of the plurality of testers 206 is connected electrically to each die on the substrate 10, for example, through a connector 207. The individual dies that are being formed within the wafer are tested for functionality.

In another embodiment, the carrier is removed prior to testing. So the wafer without carrier 30 is placed in a testing apparatus 200 in this embodiment.

In alternative embodiments, the testing may also include other types of tests such as imaging tools, for example, scatterometry, optical, x-ray, electron measurements. For example, optical methods may be used to measure the extent of the chipping of the sidewalls. In one embodiment, physical characteristics of the sidewall of the dicing channel may be monitored. For example, sidewall angle, sidewall roughness etc. may be measured.

In various embodiments, the dies are tested in parallel. For example, in one embodiment, all dies on the substrate 10 may be tested simultaneously or in parallel. Alternatively, a subset of dies on the substrate 10 may be tested simultaneously, for example, 128 or 256 dies may be tested simultaneously. In one or more embodiments, at least twenty dies may be tested in parallel, i.e., simultaneously. Testing may look for electrical as well as mechanical defects in various embodiments. Dies that do not pass a certain predetermined test may be marked as being defective. Defective dies 110 may be marginal with respect to a desired parametric and may operate at a reduced performance. For example, defects may reduce the expected life time or operate at a lower frequency. Alternatively, some defects may render the die entirely unusable. Typically, defective dies 110 (e.g., unusable dies) account for about a few percent or less of the total dies on the substrate 10. At this stage of the fabrication process, the location of the defective dies 110 may be marked so that they may be removed in subsequent steps. For example, the top surface 11 of the defective dies 110 may be marked so that they can be identified in a subsequent step for removal. Alternatively, the marking of defective dies 110 may be performed electronically in a so-called eMap (electronic map/data file which contains good and defective die positions).

Figure 4:
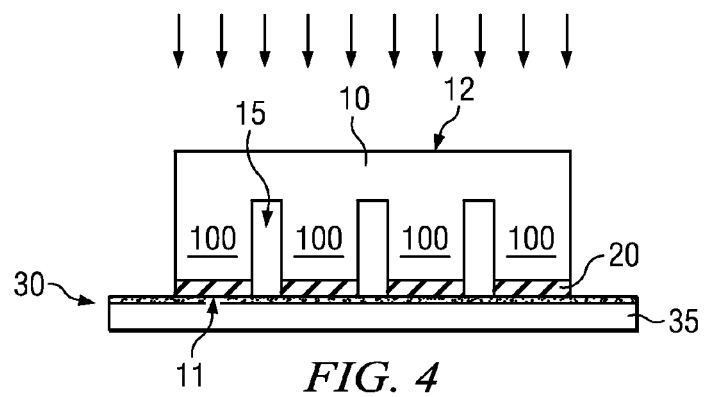

As illustrated in FIG. 4, the substrate 10 is flipped to expose the bottom surface 12 for further processing. A tape layer 35 is attached to the top surface 11 of the substrate 10 and the carrier 30 is removed from the bottom surface 12. The tape layer 35 is placed on a carrier 30, which may be the same or different from the carrier 30 in FIGS. 1D and 1E. In other embodiments, other suitable process may be used to hold the substrate 10 during the subsequent grinding process.

Figure 5:
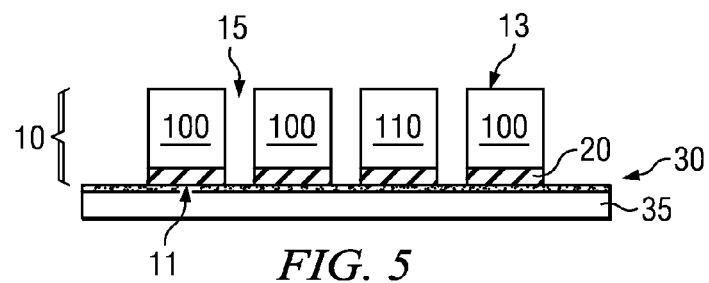

The bottom surface 12 is exposed to a grinding process (arrows in FIG. 4) that thins the substrate 10 exposing a lower surface 13. The grinding separates the substrate 10 into separate dies 100 thereby completing the singulation of the substrate 10 into dies 100 as illustrated in FIG. 5.

Figure 6:
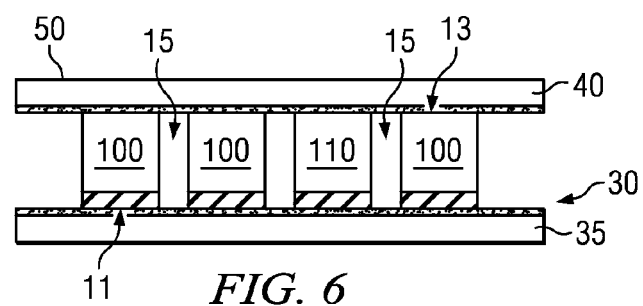

Referring to FIG. 6, a wafer frame 50 with an adhesive layer 40 is attached to the exposed lower surface 13 of the dies 100 in a relamination process. The wafer frame 50 has an annular shape (ring shaped) in one embodiment. An adhesive layer 40, which is a foil with an adhesive, is attached to the wafer frame 50 so as to support the dies 100. The adhesive layer 40 is supported along the outer edges by the wafer frame 50. The wafer frame 50 may be similar to the frame 31 illustrated in FIGS. 1D and 1E in one or more embodiments. The relamination process is required to expose the top surface 11, which may include information identifying the defective dies 110. In some embodiments, the process described in FIG. 6 may be skipped.

Figure 7A:
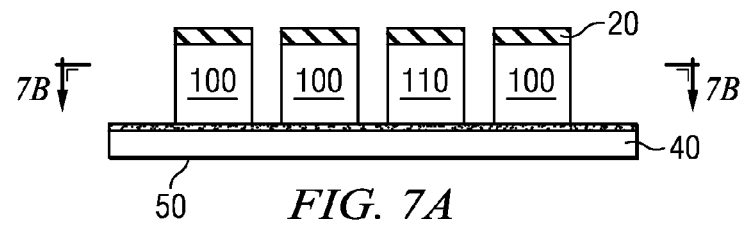
Figure 7B:
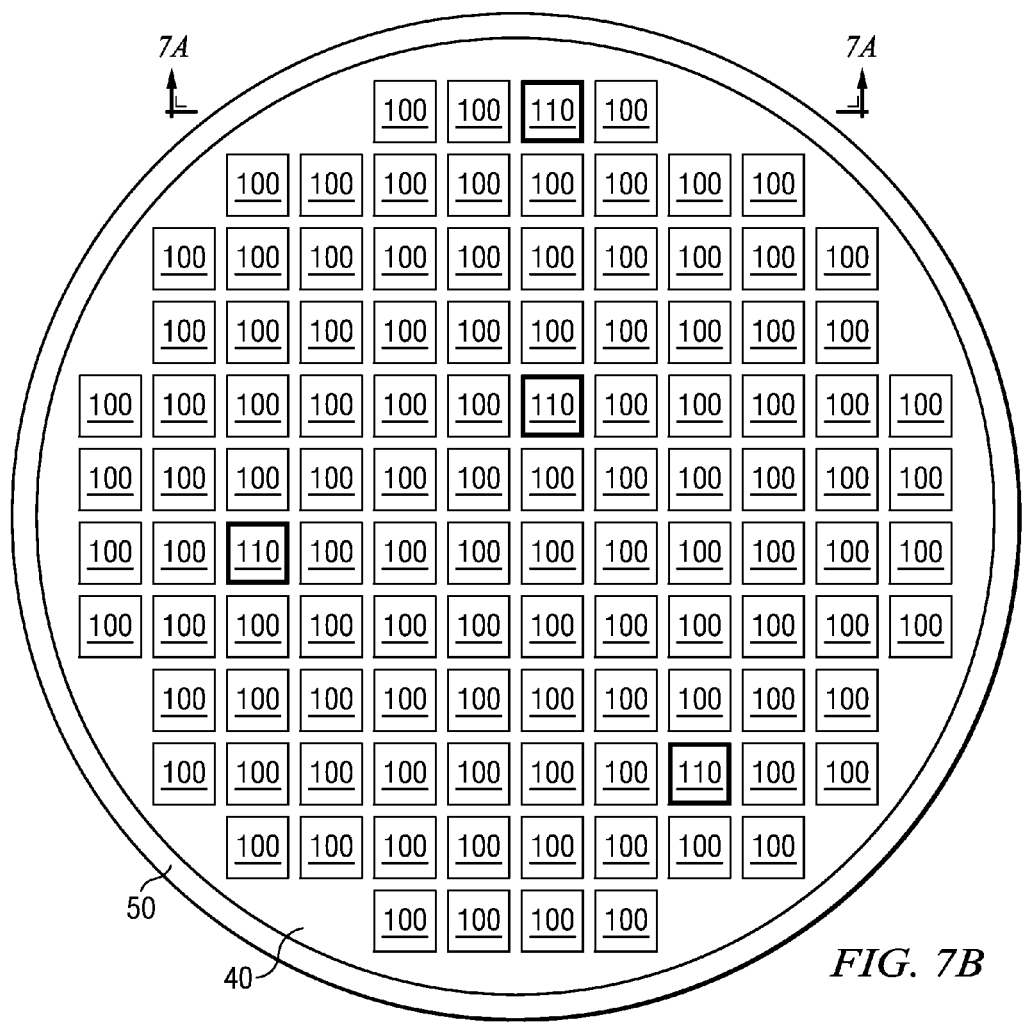

FIG. 7, which includes FIGS. 7A-7B, illustrates the dies separated by dicing channels and exposing the protective layer again. FIG. 7A illustrates a cross-sectional view while FIG. 7B illustrates a top view.

Referring now to FIG. 7, after attaching the wafer frame 50 with the adhesive layer 40, the tape layer 35 (carrier 30) is separated from the dies 100. The tape layer 35 can be safely removed from the top surface 11 because the wafer frame 40 holds the separated dies 100 in position. The protective layer 20 at the top surface 11 of the substrate 10 is exposed again. A typical wafer may yield many thousands of dies, e.g., 10,000 to 600,000, depending on the die size and the wafer size, although for illustration only a small number of dies are illustrated in the schematic of FIG. 7B.

At this stage of processing both good dies and defective dies 110 remain attached to the wafer frame 50 with the adhesive layer 40. In some embodiments, minimal testing such as contact less testing may be performed at this stage of processing.

Figure 8:
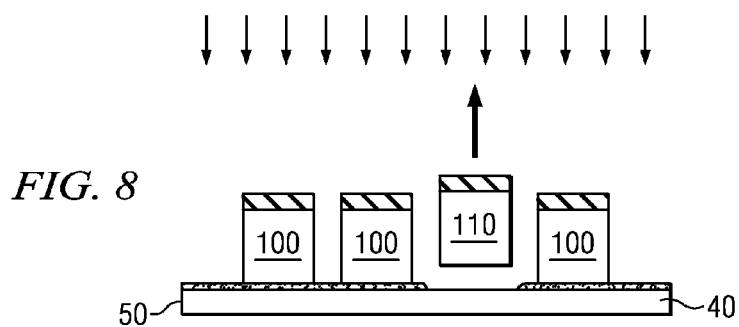

Referring to FIG. 8, the defective dies 110 that have been previously marked are removed from the wafer frame 50 with the adhesive layer 40, for example, by detaching the defective dies 110 using mechanical force. Only good (functional) dies 100 remain on the wafer frame 50 with the adhesive layer 40 after the defective dies 110 are removed.

In various embodiments, the adhesive layer 40 may be subjected to a specific treatment (shown by arrows in FIG. 8) to reduce the adhesion force of the adhesive layer 40 to the dies 100. As examples, electromagnetic irradiation may be performed, for example, a UV treatment may be performed in one embodiment. In one embodiment, a local laser process may be used in one embodiment to remove defective dies 110 from the wafer frame 50 with an adhesive layer 40 as described in U.S. application Ser. No. 13/252,816, which has been incorporated herein by reference.

Figure 9:
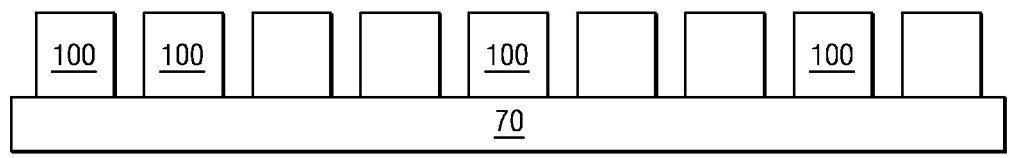

Referring next to FIG. 9, the dies 100, after being separated from the wafer frame 50 with the adhesive layer 40 are collected in a bowl 70 or other suitable apparatus (such as a transfer belt). In one embodiment, the dies 100 are separated from the wafer frame 50 using a $CO_2$ snow process or alternatively a laser process as described in U.S. application Ser. No. 13/252,816, which has been incorporated herein by reference.

Figure 10:
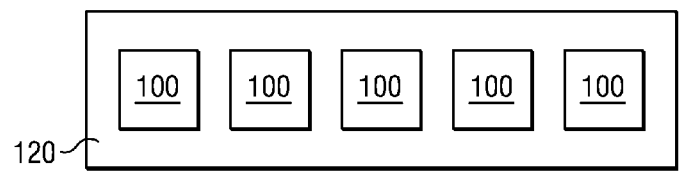

Subsequent processing continues as in conventional semiconductor processing. For example, the dies 100 are fed into a bowlfeeder handler. The bowlfeeder handler may perform optional tests (typically basic functionality tests) and may attach the dies 100 on to a tape 120 sequentially (FIG. 10). In another embodiment, the dies 100 may be placed directly on a tape 120 using a die sorting tool without having to go through the bowl 70 and the bowl feeder handler.

Figure 11:
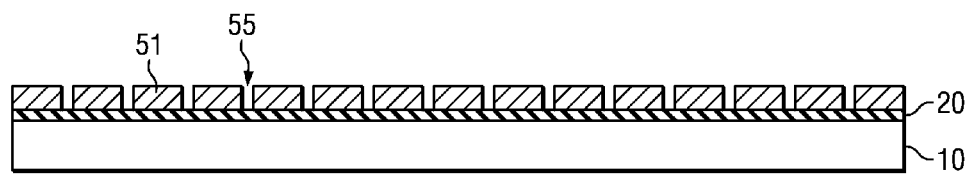
FIGS. 11 and 12 illustrate an alternative embodiment of forming the semiconductor device using a plasma dicing process in a DTG process flow.
Figure 12:
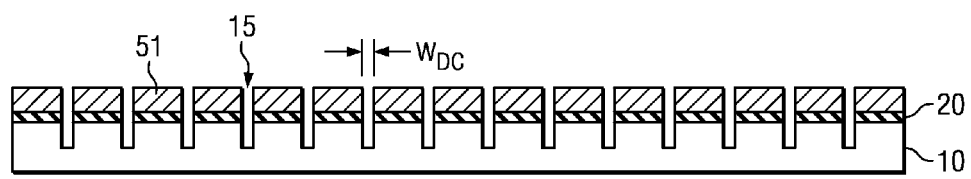

FIGS. 11 and 12 illustrate an alternative embodiment of forming the semiconductor device using a plasma dicing process.

Processing follows the prior embodiment up to FIG. 1c. FIG. 11 illustrates an embodiment showing the substrate 10 prior to dicing. A photo resist layer 51 is deposited over the substrate 10. The photo resist layer 51 is exposed and developed using conventional lithography techniques forming the illustrated patterns having trenches 55 above dicing channels 15 of the substrate 10. Plasma etching is performed using the photo resist pattern so as to form dicing channels 15 in the substrate 10 (as illustrated in FIG. 12). The plasma dicing process may use a fluorine based plasma chemistry such as $CF_4/H_2$, $CHF_3$ or alternatively a halogen based chemistry such as $Cl_2$, $Cl_2/HBr/O_2$. Because of the corrosive nature of the plasma, prior to the plasma exposure all metal components must be covered with a protective layer such as a resist.

Advantageously, the plasma dicing processes require a thinner channel width due to the smaller extent of damage and the ability of the plasma etching process to form trenches with deep aspect ratios. In one or more embodiments, a dicing channel having a width $W_{DC}$ of about 5 µm to about 50 µm is used with a plasma sawing process.

After the plasma dicing process, the photo resist layer 51 is removed using an etching process (e.g., wet etch) forming the device as illustrated in FIG. 2. The structure after removing the photo resist layer 51 is similar to the device as illustrated in FIG. 2. Subsequent processing continues as described with respect to FIG. 2-10.

Figure 13:
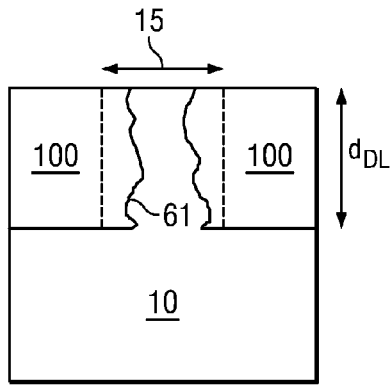
FIGS. 13 and 14 illustrate an alternative embodiment of forming the semiconductor device using a two-step dicing process in a DTG process flow.
Figure 14:
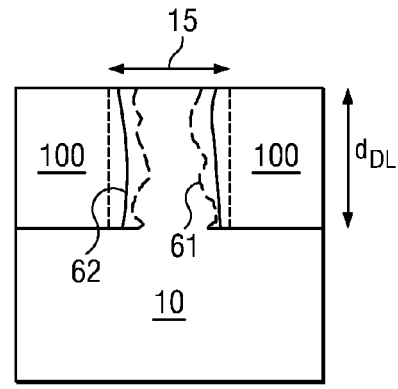

FIGS. 13 and 14 illustrate an alternative embodiment of forming the semiconductor device using a two-step dicing process.

Referring to FIG. 13, a first dicing process may be used to form a coarse dicing channel having rough sidewalls 61. In one embodiment, the first dicing process may be a mechanical sawing process that forms coarse sidewalls that are susceptible to chipping and cracking. For example, the root mean square surface roughness of the rough sidewalls 61 may be more than 20 µm, e.g., about 20 µm to about 50 µm. Subsequently, as illustrated in FIG. 14, a second dicing process may be used to smooth the rough sidewalls 61 and form smooth sidewalls 62. For example, the root mean square surface roughness of the smooth sidewalls 62 may be less than 20 µm, and about 5 µm to about 20 µm or alternatively about 1 µm to about 10 µm. In various embodiments, the ratio of the root mean square surface roughness of the smooth sidewalls 62 to the root mean square surface roughness of the rough sidewalls 61 is about 0.1:1 to about 0.8:1.

In one or more embodiments, the second dicing process may comprise a etch process such as a plasma etching or a wet etching process that reacts more strongly with the increased surface area of the corners.

In other alternative embodiments, the dicing may be performed using a plasma etch process or a combination of an etch process and a mechanical process. Embodiments of the invention also include use of irradiation processes such as lasers to (partially) dice the wafers. A laser beam may be scanned forming the dicing channels.

FIG. 15-20 illustrate an alternative embodiment of forming a semiconductor device with back side metallization using a dicing-testing-grinding process flow.

In prior embodiments, the semiconductor device did not have back side metallization. This is because the back side metallization must be formed after grinding in a wafer level process flow. However, here, the dicing precedes the grinding step and grinding separates the wafer into distinct dies. Embodiments of the invention may be modified for the DTG process flow.

Figure 15:
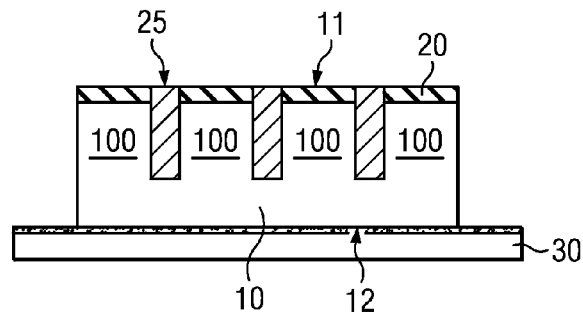
FIG. 15-20 illustrate an alternative embodiment of forming a semiconductor device with back side metallization in a DTG process flow.

FIG. 15 illustrates the device after forming the dicing channels 15 illustrated in FIG. 2. A sacrificial material 25 is filled into the dicing channels 15. The sacrificial material 25 may be a mold compound or other material that is suitable to provide a mechanical substrate after grinding the wafer from the back side. Further, the sacrificial material 25 is selected so that can be selectively removed, for example, using a wet etch process.

Figure 16:
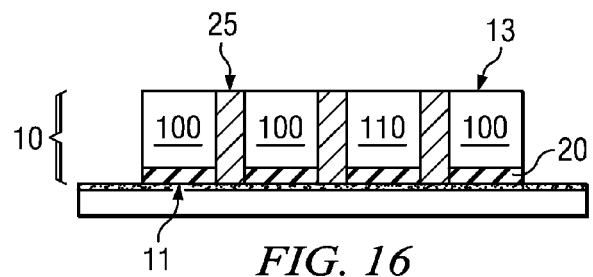

Referring next to FIG. 16, the process flow continues as described with respect to FIGS. 3 and 4. In other words, testing may be performed as described with respect to FIG. 3. Subsequently, a grinding process thins the back side of the substrate 10 exposing the lower surface 13.

In the prior embodiments described above, the grinding process results in separate dies 100. However, in this embodiment, even after back side grinding, the substrate 10 continues to be mechanically stable and is held together by the sacrificial material 25. Therefore, a back side metallization process can be performed.

Figure 17:
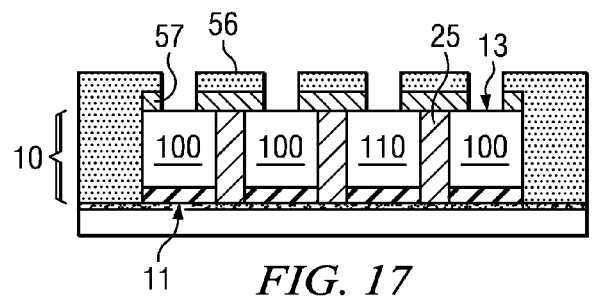

As next illustrated in FIG. 17, in one embodiment, an insulating layer 57 is deposited. A photo resist layer 56 is next deposited and may be patterned using conventional lithographic techniques. The insulating layer 57 may be patterned using the patterned photo resist layer 56 as a mask to expose a portion of the lower surface 13 of the substrate 10.

Figure 18:
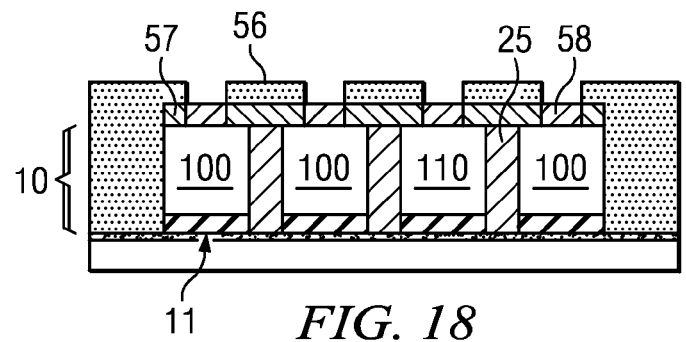
Figure 19:
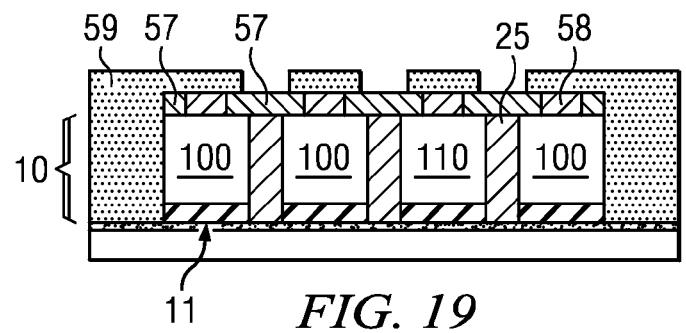
Figure 20:
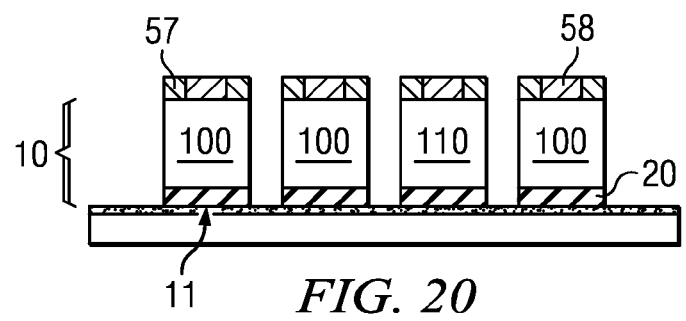

Referring to FIG. 18, in various embodiments, metallization processes may be used to form back side contacts 58 on the back side of the dies 100. For example, in one embodiment, a metal may be deposited and a silicide may be formed. In another embodiment, a metal liner may be deposited followed by formation of a solder material. In another embodiment, a metallization layer is deposited using a sputter deposition process. In this case metal is not only deposited on lower surface 13 of the substrate 10, but also on the photo resist layer 56. By a so-called "Lift-off process," the photo resist layer 56 is removed chemically together with the metal layer on top of the photo resist layer 56.

Any remaining photo resist layer 56 is removed followed by optional removal of the insulating layer 57. For example, in one embodiment, after removing the photo resist layer 56, a dicing photo resist layer 59 may be coated and developed. The patterned dicing photo resist layer 59 exposes a region of the insulating layer 57 above the sacrificial material 25. The exposed insulating layer 57 may be etched, for example, using a anisotropic etch process to expose the sacrificial material 25. The sacrificial material 25 is removed, for example, using a wet etch process that is selective with the substrate 10. Any remaining dicing photo resist layer 59 is removed resulting in the structure illustrated in FIG. 20. Subsequent processing follows as shown in FIGS. 7-10 as described earlier.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, some or all the embodiments described in FIGS.

1-10, 11-12, 13-14, and/or 15-20 may be combined together. It is therefore intended that the appended claims encompass any such modifications.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    providing a semiconductor wafer having a top surface and an opposite bottom surface, the top surface comprising a plurality of dicing channels, wherein the semiconductor wafer comprises a plurality of dies adjacent the top surface, wherein each die of the plurality of dies is separated by a dicing channel of the plurality of dicing channels from another die of the plurality of dies;
    forming trenches in the semiconductor wafer from the top surface, the trenches oriented along the plurality of dicing channels, wherein forming the trenches comprises forming coarse sidewalls using a coarse mechanical dicing process and smoothing the coarse sidewalls with an etching process performed from the top surface;
    after forming trenches, without filling the trenches, testing the plurality of dies in the semiconductor wafer to identify first dies of the plurality of dies, the first dies being identified to be separated from remaining dies of the plurality of dies; and
    after testing the plurality of dies, without filling the trenches, grinding the semiconductor wafer from the bottom surface to separate the semiconductor wafer into the plurality of dies.

2. The method of claim 1, wherein testing the plurality of dies comprises simultaneously testing at least twenty dies of the plurality of dies.

3. The method of claim 1, further comprising removing the first dies from the plurality of dies after separating the semiconductor wafer into the plurality of dies.

4. The method of claim 1, wherein a width of the dicing channel is about 10 µm to about 150 µm.

5. The method of claim 1, wherein the etching process comprises using a plasma etching process.

6. The method of claim 5, wherein a width of the dicing channel is about 5 µm to about 50 µm.

7. The method of claim 1, wherein a depth of the dicing channel is about the thickness of entire device region in the semiconductor wafer.

8. The method of claim 1, wherein the plurality of dies comprise no back side metallization.

9. The method of claim 1, wherein the semiconductor device is a chip scale package.

10. The method of claim 1, wherein testing the plurality of dies comprises using an electrical test.

11. The method of claim 1, wherein testing the plurality of dies comprises using an imaging tool.

12. A method of manufacturing a semiconductor device, the method comprising:
    providing a semiconductor wafer having a top surface and an opposite bottom surface, the top surface comprising a plurality of dicing channels, wherein the semiconductor wafer comprises a plurality of dies adjacent the top surface, wherein each die of the plurality of dies is separated by a dicing channel of the plurality of dicing channels from another die of the plurality of dies;
    coating the top surface of the semiconductor wafer with a photo resist layer;
    patterning the photo resist layer to expose a portion of the top surface;
    forming trenches in the semiconductor wafer, the trenches oriented along the plurality of dicing channels, wherein forming the trenches in the semiconductor wafer comprises forming coarse sidewalls using a coarse mechanical dicing process and etching coarse features on the coarse sidewalls from the top surface to form smooth sidewalls, and wherein a ratio of the root mean square surface roughness of the sidewalls after the etching to the root mean square surface roughness of the coarse sidewalls is about 0.1:1 to about 0.8:1;
    after forming trenches, testing the plurality of dies in the semiconductor wafer to identify defective dies of the plurality of dies; and
    after testing the plurality of dies, grinding the semiconductor wafer from the bottom surface to separate the semiconductor wafer into the plurality of dies.

13. The method of claim 12, wherein a width of the dicing channel is about 5 µm to about 50 µm.

14. The method of claim 12, wherein a depth of the dicing channel is about the thickness of entire device region in the semiconductor wafer.

15. The method of claim 12, wherein a depth of the dicing channel is about 50 µm to about 500 µm.

16. The method of claim 12, wherein the plurality of dies comprise no back side metallization.

17. The method of claim 12, wherein the semiconductor device is a chip scale package.

18. A method of manufacturing a semiconductor device, the method comprising:
    providing a semiconductor wafer having a top surface and an opposite bottom surface, the top surface comprising a plurality of dicing channels, wherein the semiconductor wafer comprises a plurality of dies adjacent the top surface, wherein each die of the plurality of dies is separated by a dicing channel of the plurality of dicing channels from another die of the plurality of dies;
    forming trenches in the semiconductor wafer from the top surface, the trenches oriented along the plurality of dicing channels;
    filling the trenches with a sacrificial material, wherein forming the trenches in the semiconductor wafer comprises forming coarse sidewalls using a coarse mechanical dicing process and smoothing the coarse sidewalls with an etching process from the top surface before filling the trenches;

after forming trenches, testing the plurality of dies in the semiconductor wafer to identify first dies of the plurality of dies, the first dies being identified to be separated from remaining dies of the plurality of dies;

after testing the plurality of dies, grinding the semiconductor wafer from the bottom surface to expose a lower surface of the plurality of dies so that the sacrificial material extends from the top surface to the lower surface;

forming back side contacts on the lower surface of the plurality of dies; and separating the plurality of dies by removing the sacrificial material.

19. The method of claim 18, further comprising removing the first dies from the plurality of dies.

20. The method of claim 19, wherein a width of the dicing channel is about 10 μm to about 150 μm.

21. The method of claim 18, wherein the etching comprises using a plasma etching process.

22. The method of claim 21, wherein a width of the dicing channel is about 5 μm to about 50 μm.

23. The method of claim 1, wherein the root mean square surface roughness of the coarse sidewalls is greater than 20 μm, wherein the root mean square surface roughness of the sidewalls after smoothing is 1 μm to about 10 μm.

24. The method of claim 1, wherein a ratio of the root mean square surface roughness of the sidewalls after the smoothing to the root mean square surface roughness of the coarse sidewalls is about 0.1:1 to about 0.8:1.

25. The method of claim 1, wherein the etching process comprises using a wet etching process.

* * * * *